United States Patent [19]

Dick

[11] Patent Number: 5,608,349

[45] Date of Patent: Mar. 4, 1997

[54] CIRCUIT ARRANGEMENT WITH ADJUSTABLE AMPLITUDE-FREQUENCY RESPONSE

[75] Inventor: Burkhard Dick, Hamburg, Germany

[73] Assignee: U.S. Philips Corporation, New York, N.Y.

[21] Appl. No.: 420,264

[22] Filed: Apr. 11, 1995

[30] Foreign Application Priority Data

Apr. 21, 1994 [GB] United Kingdom .................... 4413928

[51] Int. Cl.$^6$ ................................ H03K 5/00; H03B 1/00
[52] U.S. Cl. ........................ 327/553; 327/552; 327/558; 327/559; 327/113; 327/178
[58] Field of Search ...................... 327/306, 315, 327/331, 553, 178, 179, 113, 552, 551, 555, 556, 557, 558, 559; 364/724.2; 333/18

[56] References Cited

U.S. PATENT DOCUMENTS

| 4,480,236 | 10/1984 | Harris | 327/553 |
| 4,967,161 | 10/1990 | Furuhata et al. | 327/113 |
| 5,050,186 | 9/1991 | Gurcan et al. | 375/14 |

FOREIGN PATENT DOCUMENTS

| 0011446 | 5/1980 | European Pat. Off. |
| 2537140 | 3/1977 | Germany . |
| 62-285508 | 11/1987 | Japan . |
| 2209642 | 5/1989 | United Kingdom . |

*Primary Examiner*—Timothy P. Callahan
*Assistant Examiner*—Dinh T. Le
*Attorney, Agent, or Firm*—Bernard Franzblau

[57] ABSTRACT

A circuit arrangement with an adjustable amplitude-frequency response between an input signal terminal and an output signal terminal can be changed over simply between a fourth-order high-pass or low-pass characteristic and a second-order all-pass characteristic. The circuit includes first and third filters each with a filter function F, a second filter with a filter function G, a plurality of coefficient sections and first and second summing stages all coupled together so that the circuit has a transfer function A between the input signal terminal and the output signal terminal with a component complying with $$A=(C+(1-C)\cdot F-2\cdot C\cdot G)\cdot (C(1-C)\cdot F),$$

where $$F=FN=1/(1+a\cdot s+b\cdot s^2)$$

or $$F=FH=b\cdot s^2/(1+a\cdot s+b\cdot s^2)$$

represents a first filter function with a second-order high-pass or a low-pass characteristic and $$G=a\cdot s/(1+a\cdot s+b\cdot s^2)$$

represents a second filter function, and where
a, b are constant real factors,
C is a real factor whose magnitude is selectable between 0 and 1 inclusive, and
s is the product of the imaginary unit and the angular frequency ($\omega$).

7 Claims, 2 Drawing Sheets

CIRCUIT ARRANGEMENT WITH ADJUSTABLE AMPLITUDE-FREQUENCY RESPONSE

BACKGROUND OF THE INVENTION

The present invention relates to a circuit arrangement with an adjustable amplitude-frequency response between an input, which is arranged to receive an input signal, and an output for taking off an output signal.

DE-PS 25 37 140 describes a method of correcting the amplitude response of an FM radio channel of a radio-relay system without the phase response and, directly associated therewith, the envelope delay, being adversely affected, shunted T networks being used as all-pass filters. In order to provide correction for the attenuation of the delay equalizer in the transmission band, this method, in contradistinction to the dimensioning customary for an idealised all-pass filter with loss-free elements where the attenuation is constant as a function of the frequency, provides a parabolic roll-off relative to this constant attenuation towards smaller values in a manner such that the degree of the parabola corresponds to the degree of the distortion. However, such an arrangement only provides an approximate independence of the phase response of the amplitude response merely for a fixed amplitude and a fixed amplitude response, i.e. for so-called all-pass filters.

EP-PS 11 446 describes a circuit arrangement with an adjustable frequency response, comprising a first filter circuit, a first amplifier to amplify the output signal of the filter circuit, a second amplifier to amplify a signal which forms the difference between the input signal and the output signal of the filter circuit, and an adder to add the output signals of the first and the second amplifier. In this known circuit arrangement the filter circuit further comprises a capacitor and a variable-gain amplifier, at least the first or the second amplifier being a variable-gain amplifier, and also includes means for generating a gain control signal, which means are connected to the first and/or the second amplifier forming the variable-gain amplifier(s) and the variable-gain amplifier of the filter circuit, to generate a control signal for controlling the gain factor of the first or the second amplifier and at the same time adjusting the cut-off frequency of the filter circuit. However, such a circuit arrangement does not provide a phase response independent of the frequency response.

JP-A-62-285 508 discloses a circuit arrangement by means of which the gain at a given frequency can be varied without a variation of the phase response and the delay characteristic. This known circuit arrangement comprises a first, a second and a third differential amplifier. An input signal is applied from a signal input to the non-inverting inputs of the first and the second differential amplifier. A signal from the non-inverting output of the second differential amplifier is applied both to a grounded capacitor and to the non-inverting input of the third differential amplifier. The inverting output of the first differential amplifier and the non-inverting output of the third differential amplifier are connected to a signal output, which is also connected to all of the inverting inputs of the three differential amplifiers and, in addition, to the signal input via a second capacitor. The slope of the first differential amplifier can be controlled by means of a control circuit.

However, this circuit arrangement is invariably based on a given transfer characteristic. There are no suggestions to adapt this known circuit arrangement so as to obtain different transfer characteristics, for example, a high-pass or a low-pass characteristic. Moreover, the multiple feedback from the output terminal to the various inputs of the differential amplifiers results in an unpredictable oscillation tendency of the arrangement.

Moreover, GB-A 2,209,642 discloses different circuit arrangements by means of which a signal is to be modified in an adjustment mode or should not be influenced in another mode, in which last-mentioned mode neither the amplitude nor the phase of the input signal should be changed. In these circuit arrangements the gain factors of the various operational amplifiers used therein are varied relative to one another in accordance with a given relationship in order to modify the gain or phase characteristics of the individual circuits independently of one another or, in the other mode, they are equalised or set to unity.

The circuit arrangements mentioned here resemble the arrangement in accordance with JP-A-62-285 508 as regards their construction and properties and consequently have the same drawbacks.

SUMMARY OF THE INVENTION

It is an object of the invention to provide a circuit arrangement of the type defined in the opening paragraph which is continuously variable between an all-pass characteristic and a fourth-order low-pass or high-pass characteristic without a change of the phase-frequency response, i.e. the phase shift of the signal in the circuit arrangement as a function of the frequency.

According to the invention this object is achieved by a transfer function A between the input signal and the output signal with a component complying with $$A=(C+(1-C)\cdot F-2\cdot C\cdot G)\cdot(+(1-C)\cdot F),$$

where F represents a first filter function at option with a second-order high-pass characteristic $$F=FH=b\cdot s^2/(1+a\cdot s+b\cdot s^2)$$

or with a second-order low-pass characteristic $$F=FN=1/(1+a\cdot s+b\cdot s^2),$$

and G represents a second filter function G with a second-order band-pass characteristic $$G=a\cdot s/(1+a\cdot s+b\cdot s^2)$$

and where a, b are constant real factors,
C is a real factor whose magnitude is selectable between 0 and 1 inclusive, and
s is the product of the imaginary unit and the angular frequency.

With the prior-art methods and circuit arrangements described in the introductory part it regularly happens that a change in the amplitude-frequency response produces unwanted noise in a frequency-modulated signal, which is caused by the change in the envelope delay as a function of the frequency associated with the change in amplitude-frequency response. Such noise components may manifest themselves, for example, as clicks during the reception and processing of a sound signal.

The invention is based on the recognition of the fact that the described noise components can be eliminated very effectively and reliably if the circuit arrangement in accordance with the invention can be constructed in such a manner that its phase-frequency response becomes independent of the desired variations of the amplitude-frequency response. The invention provides a circuit arrangement having a phase-frequency response and hence an envelope delay which does not vary when its cut-off frequency is changed. In this way said noise components can be avoided.

The circuit arrangement in accordance with the invention enables fourth-order low-pass as well as high-pass filters to be constructed whose transfer functions can be determined by an appropriate choice and dimensioning of the first and the second filter function. The amplitude-frequency response, particularly the bandwidth, of the transfer function A between the input signal and the output signal can then be adjusted by adjusting the value of the real factor C for the selected first filter function, i.e. for the selected design of the circuit arrangement in accordance with the invention.

In accordance with a further solution the circuit arrangement in accordance with the invention comprises a first circuit section comprising first summing stage having a first add input coupled to the input via a first coefficient section, a second add input coupled to the input via a filter stage having a first filter function F which optionally has a second-order high-pass or low-pass characteristic, a first subtract input coupled to the second add input via a second coefficient section 8, a second subtract input coupled to the input via a cascade arrangement of a second filter stage having a second filter function G, which has a second-order band-pass characteristic, and a third coefficient section, and a first intermediate-result output, as well as a second circuit section comprising a second summing stage having a third add input coupled to the first intermediate-result output via a fourth coefficient section, a fourth add input coupled to the first intermediate-result output via a third filter stage having the first filter function F, a third subtract input coupled to the fourth add input via a fifth coefficient section, and a second intermediate-result output coupled to the output, the signals applied to the first, the second, the fourth and the fifth coefficient section being multiplied by a real factor C in these sections, the magnitude of this factor being selectable between 0 and 1 inclusive, and the signal applied to the third coefficient section being multiplied by the factor 2·C in this section.

This circuit arrangement is of a modular construction, which owing to the design of the first and the third filter stage, which both have the first filter function, can be adapted simply to different signal processing requirements. All five coefficient sections are then adjusted in the same sense.

In another variant several transfer functions of the type in accordance with the invention can be cascaded with one another, which transfer functions may be identical or may differ from one another arbitrarily. To this end the circuit arrangement in accordance with the invention preferably comprises at least one further stage of the same construction as the cascade of the first and the second circuit section, which further stage is cascaded with the cascade of the first and the second circuit section. In these further stages, which have a corresponding circuit structure but whose filter functions F may differ from stage to stage, the factors C may also differ from stage to stage, either variable or fixedly selected.

BRIEF DESCRIPTION OF THE DRAWINGS

Embodiments of the invention will now be described in more detail, by way of example, with reference to the accompanying drawings, in whose Figures like elements bear the same reference symbols. In the drawings.

DESCRIPTION OF THE PREFERRED EMBODIMENTS

Figure 1:
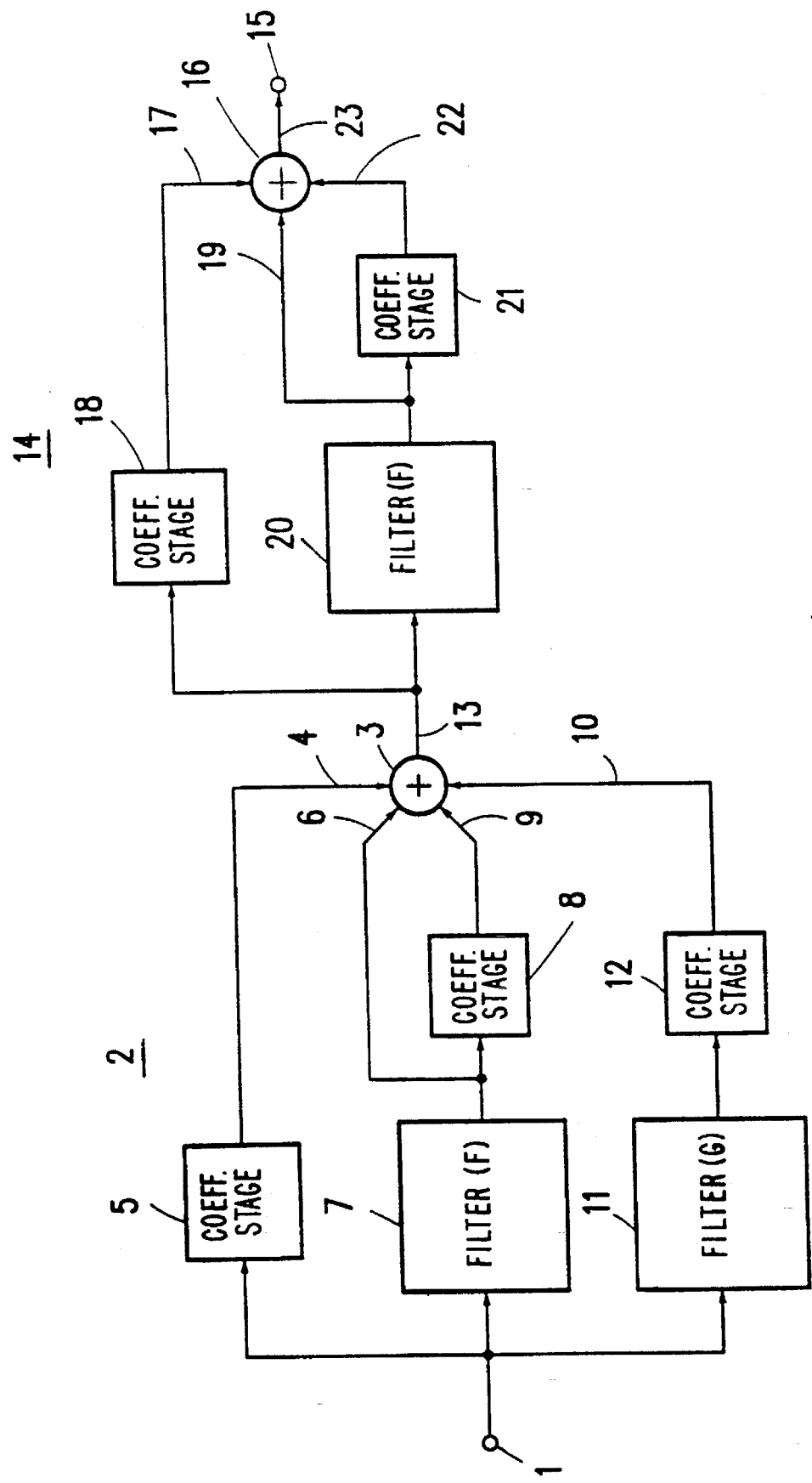
FIG. 1 is a block diagram of a circuit arrangement in accordance with the invention.

In FIG. 1 an input referenced 1 is arranged to receive an input signal. A first circuit section 2 of the circuit arrangement shown in FIG. 1 comprises a first summing stage 3 having a first add input 4 coupled to the input 1 via a first coefficient section 5. A second add input 6 of the first summing stage 3 is coupled to the input 1 via a filter stage 7 having a first filter function F and to a first subtract input 9 of the first summing stage 3 via a second coefficient section 8. Moreover, a second subtract input 10 of the first summing stage 3 is coupled to the input 1 via a cascade arrangement of a second filter stage 11 and a third coefficient section 12. The second filter stage 11 has a second filter function G. In the first and the second coefficient section 5 and 8, respectively, the signals applied to them are multiplied by a real factor C and in the third coefficient section 12 by a factor 2·C. In the first summing stage 3 the signals applied via the inputs 4, 6, 9, 10 are added to one another, i.e. the signals at the add inputs 4, 6 with a positive sign and the signals at the subtract inputs 9, 10 with a negative sign. An intermediate-result signal obtained by this addition appears at an intermediate-result output 13 of the first summing stage 3.

The circuit arrangement shown in FIG. 1 further comprises a second circuit section 14 cascaded with the first section 2 between the input 1 and an output 15. An output signal of the circuit arrangement of FIG. 1 appears at the output 15. The second circuit section 14 comprises a second summing stage 16 having a third add input 17 coupled to the first intermediate-result output 13 via a fourth coefficient section 18. A fourth add input 19 of the second summing stage 16 is coupled to the first intermediate-result output 13 via a third filter stage 20 having the first filter function F and to a third subtract input 22 of the second summing stage 16 via a fifth coefficient section 21. The second summing stage 16 also adds the signals at its inputs to one another, i.e. the signals at the add inputs 17, 19 with a positive sign and the signals at the subtract input 22 with a negative sign. The result of this addition appears as an output signal at an intermediate-result output 23 of the second summing stage 16. This second intermediate-result output 23 is connected to the output 15. The signals applied to the fourth and the fifth coefficient section 18, 21 are multiplied by the factor C in these sections.

In accordance with the circuit arrangement thus described, a transfer function A between the input signal and the output signal is achieved. This transfer function is given by the formula:

$$A=(C+(1-C)\cdot F-2\cdot C\cdot G)\cdot(C+(1-C)\cdot F).$$

The first filter function F can be a low-pass function FN or a high-pass function FH, as desired, and are both second-order functions. The low-pass function FN, i.e. the first filter function F with a second-order low-pass characteristic, then complies with $$F=FN=1/(1+a\cdot s+b\cdot s^2),$$

whereas the high-pass function, i.e. the first filter function F with a second-order high-pass characteristic, complies with $$F=FH=b \cdot s^2/(1+a \cdot s+b \cdot s^2).$$

The second filter function G in each case complies with $$G=a \cdot s/(1+a \cdot s+b \cdot s^2).$$

Here, a and b are constant real factors, which follow from the dimensioning of the parts used for the filter stages 7, 11, 20. The parameter s is the product of the imaginary unit and the angular frequency (iω), where $i=\sqrt{-1}$ and $\omega=2\pi f$. For a given dimensioning of the circuit arrangement in FIG. 1 the filter functions F and G can be realised advantageously by means of identically dimensioned parts (inductance, capacitance and resistance), which should merely be arranged differently relative to one another in order to implement the filter functions FN, FH and G. The real factor C is such that it can be selected between the values 0 and 1 inclusive. When the real factor C is adjusted the coefficient sections 5, 8, 12, 18, 21 are adjusted to correspond to each other, allowance being made for the fact that the third coefficient section 12 represents the factor 2·C.

Figure 2:
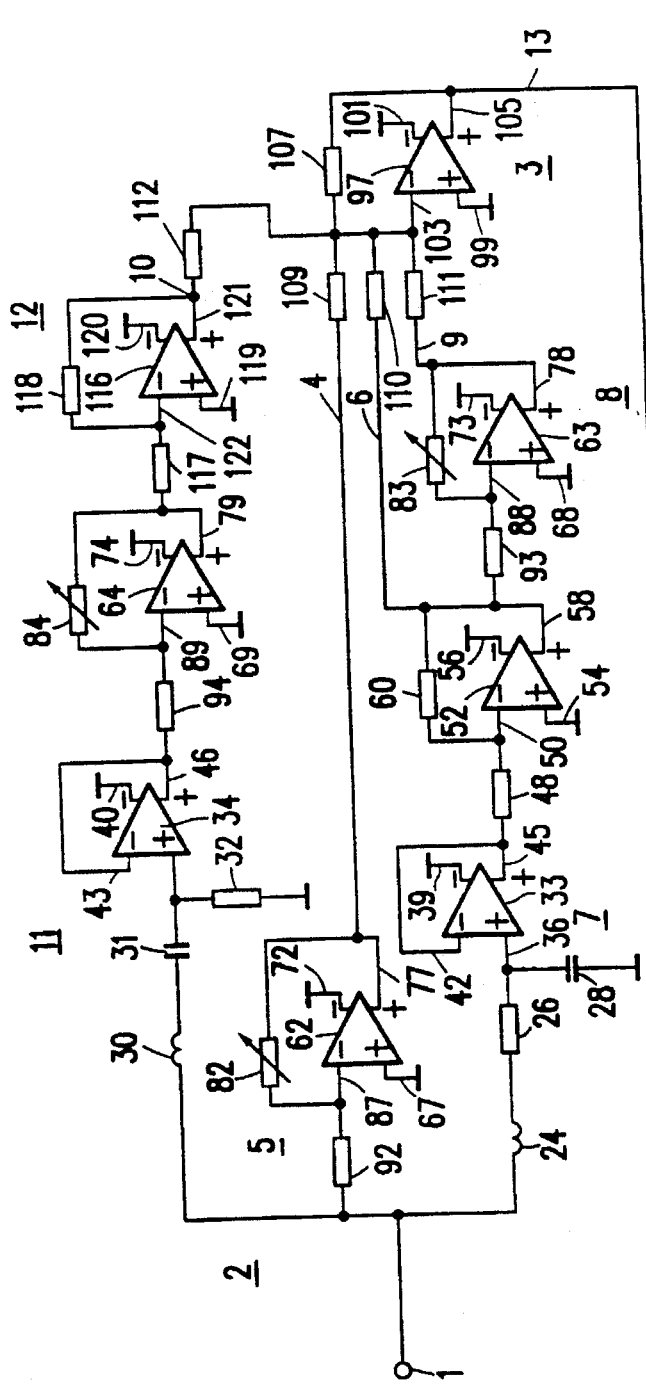
FIG. 2 is a derailed circuit diagram of a further embodiment of the invention.
Figure 2:
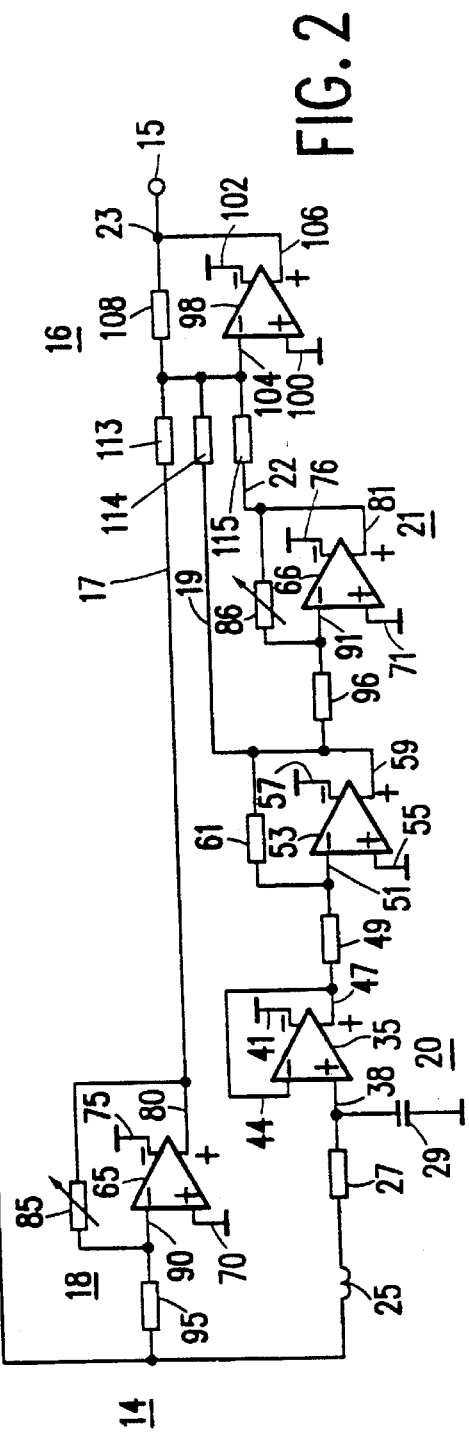

FIG. 2 shows a detailed example of the circuit arrangement in accordance with the invention with a first filter function F taking the form of a low-pass function FN. To this end the first filter stage 7 and the third filter stage 20 each comprise a series arrangement of an inductance, 24 or 25, and a resistor, 26 or 27, which has one side connected to the input 1 or the first intermediate-result output 13, respectively, and which has its other side coupled to ground by a capacitance, 28 or 29. The second filter stage 11 comprises a series arrangement of an inductance 30 with a capacitance 31, which has one side connected to the input 1 and its other side coupled to ground via a resistor 32. The inductances 24, 25, 30, the capacitances 28, 29, 31 and the resistors 26, 27, 32 are dimensioned correspondingly.

The three filter stages 7, 11 and 20 each further comprise a differential amplifier 33, 34 or 35, having its non-inverting input 36, 37, 38 connected to the node between the resistor, 26 or 27, and the capacitance, 28 or 29, in the first and the third filter stage 7 and 20, respectively, and between the capacitance 31 and the resistor 32 in the second filter stage 11. The differential amplifiers 33, 34 and 35 each have an inverting output 39, 40 or 41 connected to ground and have an inverting input 42, 43 or 44 connected to the respective non-inverting output 45, 46 or 47.

The connection between the non-inverting output 46 of the differential amplifier 34 of the second filter stage 11 and the inverting input 43 forms the output of this second filter stage 11. However, in the first and the third filter stage 7 and 20 the corresponding connection between the non-inverting output 45 or 47 of the respective differential amplifier 33 or 35 and the inverting input 42 or 44 is coupled to an inverting input 50 or 51 of a differential amplifier 52 or 53 via a resistor 48 or 49, which differential amplifier has its non-inverting input 54 or 55 and its inverting output 56 or 57 connected to ground and has feedback from its non-inverting output 58 or 59 to the inverting input 50 or 51 via a respective further resistor 60 or 61. The resistors 48, 60 and 49, 61, respectively, are preferably dimensioned to be equal, all four resistors being in particular equal to one another, so that the differential amplifiers 52 and 53 form impedance matching stages with unity gain, which decouple the first and third filter stage 7 and 20, respectively, from the subsequent circuit parts. The non-inverting outputs 58 and 59 of the differential amplifiers 52 and 53, respectively, then form the outputs of the filter stages 7 and 20, respectively.

Each of the five coefficient sections 5, 8, 12, 18 and 21 in FIG. 2 comprises a differential amplifier 62, 63, 64, 65 and 66, respectively, which amplifiers are constructed and arranged identically. The differential amplifiers 62 to 66 each have a non-inverting input 67, 68, 69, 70 and 71, respectively, and an inverting output 72, 73, 74, 75 and 76, connected to ground. Feedback is applied from a non-inverting output 77, 78, 79, 80 or 81 to an inverting input 87, 88, 89, 90 and 91, respectively, via a variable resistor 82, 83, 84, 85 and 86, respectively, and a signal to be applied to the respective coefficient section 5, 8, 12, 18 or 21 is supplied to the associated inverting input 87, 88, 89, 90 or 91 via an input resistor 92, 93, 94, 95 and 96, respectively. Accordingly, the input resistor 92 of the first coefficient section 5 is connected to the input 1, the input resistor 93 of the second coefficient section 8 to the non-inverting output 58 of the differential amplifier 52 in the first filter stage 7, the input resistor 94 of the third coefficient section 12 to the non-inverting output 46 of the differential amplifier 34 in the second filter stage 11, the input resistor 95 of the fourth coefficient section 18 to the first intermediate-result output 13, and the input resistor 96 of the fifth coefficient section 21 to the non-inverting output 59 of the differential amplifier 53 of the third filter stage 20.

The non-inverting outputs 77, 78, 79, 80 and 81 of the differential amplifiers 62, 63, 64, 65 and 66, respectively, thus form the outputs of the first, second, third, fourth and fifth coefficient sections 5, 8, 12, 18 and 21, respectively. The non-inverting output 77 of the differential amplifier 62 is then connected to the first add input 4, the non-inverting output 78 of the differential amplifier 63 to the first subtract input 9, the non-inverting output 80 of the differential amplifier 65 to the third add input 17, and the non-inverting output 81 of the differential amplifier 66 to the third subtract input 22. The maximum values of the variable resistors 82, 83, 84, 85, 86 correspond to the values of the input resistors 92, 93, 94, 95 and 96, respectively. By means of the coefficient sections 5, 8, 18, 21 and the differential amplifier 64 of the third coefficient section 12, arranged as described above, it is thus possible to obtain coefficient values smaller than or equal to 1.

The summing stages 3 and 16 each also comprise a differential amplifier 97 and 98, respectively, which have their non-inverting inputs 99 and 100, respectively, and their inverting outputs 101 and 102, respectively, connected to ground. The differential amplifiers 97 and 98 have their respective inverting inputs 103 and 104 connected to their non-inverting outputs 105 and 106, respectively, via a feedback resistor 107 and 108, respectively. The non-inverting output 105 of the differential amplifier 97 forms the first intermediate-result output 13 of the first summing stage 3 and the non-inverting output 106 of the differential amplifier 98 forms the second intermediate-result output 23 of the second summing stage 16 and hence the output 15 for the output signal of the circuit arrangement shown in FIG. 2.

The inverting input 103 of the differential amplifier 97 of the first summing stage 3 is connected to the non-inverting output 77 of the differential amplifier 62 of the first coefficient section 5 via a first input resistor 109, to the non-inverting output 58 of the differential amplifier 52 in the first filter stage 7 via a second input resistor 110, and to the non-inverting output 78 of the differential amplifier 63 of the second coefficient section 8 via a third input resistor 111. The connection via the first input resistor 109 of the first summing stage 3 forms the first add input 4, the connection via the second input resistor 110 forms the second add input 6, and the connection via the third input resistor 111 forms the first subtract input 9. Likewise, the inverting input 104 of the differential amplifier 98 of the second summing stage 16 is connected to the non-inverting output 80 of the differential amplifier 65 of the fourth coefficient section 18 via a first input resistor 113, to the non-inverting output 59 of the differential amplifier 53 of the third filter stage 20 via a second input resistor 114, and to the non-inverting output 81 of the differential amplifier 66 of the fifth coefficient section 21 via a third input resistor 115. Thus, the connection via the first input resistor 113 of the second summing stage 16 forms the third add input 17 of this stage, the connection via the second input resistor 114 forms the fourth add input 19, and the connection via the third input resistor 115 forms the third subtract input 22. Preferably, the feedback resistor 107 and the input resistors 109, 110, 111 of the first summing stage 15 as well as the feedback resistor 108 and the input resistors 113, 114, 115 of the second summing stage 16 are dimensioned correspondingly. As a result of this, the summing stages 3 and 16 have unity gain for the inputs and outputs described above. Preferably, all of the input resistors 109, 110, 111, 113, 114, 115 and the feedback resistors 107, 108 are dimensioned correspondingly. The second subtract input 10 of the first summing stage 3 is formed by a connection of the inverting input 103 of the differential amplifier 97 via a fourth input resistor 112. In the embodiment shown in FIG. 2 this fourth resistor 112 has only half the resistance value of the input resistors 109 to 111 of the differential amplifier 97 of the first summing stage 3. Thus, in conjunction with the feedback resistor 107 this yields a gain factor of 2 for the signal voltage applied via the fourth input resistor 112. Together with the factor C of the differential amplifier 64 of the third coefficient section 12 this yields the multiplication factor of 2·C to be realised by means of this third coefficient section 12. The third coefficient section 12 has a decoupling and impedance matching stage via which the signal is coupled from the non-inverting output 79 of the differential amplifier 64 to the second subtract input 10 and which in agreement with the corresponding stages 48, 50, 52, 54, 56, 60 and 49, 51, 53, 55, 57, 59, 61 comprises a second differential amplifier 116, a second resistor 117 and a second feedback resistor 118. A non-inverting input 119 and an inverting output 120 of the second differential amplifier 116 of the third coefficient section 12 are connected to ground, a non-inverting output 121 being coupled to an inverting input 122 via the second feedback resistor 118. The inverting input 122 of the second differential amplifier 116 is connected to the non-inverting output 79 of the differential amplifier 64 via the second resistor 117 and the non-inverting output 121 constitutes the second subtract input 10. In the case of a corresponding dimensioning of the second resistor 117 and the second feedback resistor 118 the decoupling and impedance-matching stage with the second differential amplifier 116 also has unity gain.

In a variant of the circuit arrangement shown in FIG. 2, particularly the implementation of the third coefficient section 12 shown therein, the variable resistor 84 and the second feedback resistor 118 may be interchanged. In another variant the second resistor 117 of the third coefficient section 12 and the fourth input resistor 112 of the first summing stage 3 may also be interchanged. In the last-mentioned case a circuit arrangement is obtained which is directly based upon the block diagram of FIG. 1 in that the first summing stage 3 has unity gain for all its inputs 4, 6, 9 and 10 and the third coefficient section 12 comprises two cascaded parts defined by the respective differential amplifiers 64 and 116 and their arrangement and having a gain factor C (differential amplifier 64) and a gain factor of 2 (second differential amplifier 116), i.e. together the gain factor 2·C.

The individual differential amplifiers 33, 34, 35, 52, 53, 62, 63, 64, 65, 66, 97, 98 and 116 are arranged to be inverting and non-inverting and are interconnected as described above, in such a manner that ultimately the required polarities or signs of the signals to be processed and combined are obtained in accordance with the additions and subtractions to be performed.

In a variant of the embodiment shown in FIG. 2 the inductances 24, 25, the capacitances 28, 29 and the resistors 26, 27 in the first and third filter stages 7 and 20, respectively, may be replaced by other elements which instead of a second-order low-pass characteristic have a second-order high-pass characteristic as the first filter function F. Instead of the filter function $$F=FN=1/(1+a·s+b·s^2)$$

this will yield the filter function $$F=FH=b·s^2/(1+a·s+b·s^2).$$

This modification of the first filter function F can be obtained simply by changing the arrangement of the inductances 24 and 25 and the capacitances 28 and 29, so that the respective capacitances 28 and 29 are now connected to the input 1 and the first intermediate-result output 13 and the inductances 24 and 25 are now connected to ground. With this rearrangement of the elements the inductance 30, the capacitance 31 and the resistor 32 of the second filter stage 11 having the second filter function G need not be changed.

To adjust the amplitude-frequency response of the circuit arrangement shown in FIG. 2 the variable resistors 82 to 86 should be adjusted in the same sense. For the sake of simplicity this is not explicitly shown in FIG. 2.

In a variant, not shown, of the embodiments shown in FIGS. 1 and 2, the circuit arrangements shown therein may be cascaded with one or more further stages of similar or identical construction. This enables combinations with further signal processing or shaping functions to be obtained which are capable of producing different and more complicated filter characteristics. In the simplest case the circuit arrangements in FIGS. 1 and 2 are cascaded with identical arrangements, so that for example, higher-order low-pass or high-pass characteristics can be obtained.

I claim:

1. A circuit arrangement with an adjustable amplitude-frequency response between an input coupled to receive an input signal and an output for taking off an output signal without a change of phase/frequency response, said circuit arrangement comprising:

at least first and second filters and an adjustable coefficient section coupled between said input and said output of the circuit arrangement, said first and second filters having first and second filter transfer functions F and G, respectively, and characterized by a transfer function A between the input signal and the output signal with a component complying with $$A=(C+(1-C)·F-2·C·G)·(C+(1-C)·F),$$

where F represents the first filter transfer function having one of a second-order high-pass characteristic $$F=FH=b·s^2/(1+a·s+b·s^2)$$

and a second-order low-pass characteristic $$F=FN=1/(1+a \cdot s+b \cdot s^2),$$

and G represents the second filter transfer function having a second-order band-pass characteristic $$G=a \cdot s/(1+a \cdot s+b \cdot s^2)$$

and where a, b are constant real factors,

C is a real factor of said adjustable coefficient section whose magnitude is selectable between 0 and 1 inclusive, and s is the product of the imaginary unit and the angular frequency ($\omega$).

2. A circuit arrangement with an adjustable amplitude-frequency response between an input coupled to receive an input signal and an output for taking off an output signal, comprising:

a first circuit section comprising a first summing stage having a first intermediate-result output and having a first add input coupled to the input via a first adjustable coefficient section, a second add input coupled to the input via a filter stage having a first filter transfer function F which has one of a second-order high-pass and low-pass characteristic, a first subtract input coupled to the second add input via a second adjustable coefficient section, a second subtract input coupled to the input via a cascade arrangement of a second filter stage having a second filter transfer function G, which has a second-order band-pass characteristic, and a third adjustable coefficient section, and means coupling the first intermediate-result output to a second circuit section comprising a second summing stage having a third add input coupled to the first intermediate-result output via a fourth adjustable coefficient section, a fourth add input coupled to the first intermediate-result output via a third filter stage having the first filter transfer function F, a third subtract input coupled to the fourth add input via a fifth adjustable coefficient section, and wherein an output of the second summing stage is coupled to the output, signals applied to the first, the second, the fourth and the fifth adjustable coefficient section being multiplied by a real factor C in said sections, the magnitude of said factor being selectable between 0 and 1 inclusive, and a signal applied to the third adjustable coefficient section being multiplied by the factor 2·C in said third adjustable coefficient section.

3. A circuit arrangement as claimed in claim 2, further comprising at least one further stage of the same construction as the cascade of the first and the second circuit section and connected in cascade with the cascade of the first and the second circuit section.

4. A filter circuit having a controllable transfer function and which comprises:

an input terminal for receiving an input signal, an output terminal for supplying an output signal, first and second filters having respective filter transfer functions F and G, a third filter having a filter transfer function F, first and second combination circuits each having input means and an output, a first plurality of adjustable coefficient sections, a second plurality of adjustable coefficient sections, first means for coupling said first and second filters and said first plurality of adjustable coefficient sections together between said input terminal and the input means of the first combination circuit, second means for coupling said third filter and said second plurality of adjustable coefficient sections together between the output of the first combination circuit and the input means of the second combination circuit, all in a manner whereby the filter circuit has a transfer function $$A=(C+(1-C) \cdot F - 2 \cdot C \cdot G) \cdot (C+(1-C) \cdot F),$$

where F is a filter transfer function having one of a second-order high-pass characteristic $$FH=b \cdot s^2/(1+a \cdot s+b \cdot s^2)$$

and a second-order low-pass characteristic $$FN=1/(1+a \cdot s+b \cdot s^2)$$

and G is a filter transfer function having a second-order band-pass characteristic $$G=a \cdot s/(1+a \cdot s+b \cdot s^2)$$

and C is a real number of said first and second plurality or adjustable coefficient sections with a value between 0 and 1 inclusive, a and b are constant real numbers, and s=i$\psi$, and third means for coupling said output of the second combination circuit to said output terminal.

5. The filter circuit as claimed in claim 4 wherein:

said first plurality of adjustable coefficient sections comprise first, second and third adjustable coefficient sections having coefficient factors C,C and 2C, respectively, said input means of the first combination circuit comprises first, second, third and fourth respective inputs, and said first coupling means couples the first adjustable coefficient section between the input terminal and the first input of the first combination circuit, the first filter between the input terminal and the second input of the first combination circuit, the first filter and the second adjustable coefficient section in series between the input terminal and the third input of the first combination circuit, and the second filter and the third adjustable coefficient section in series between the input terminal and the fourth input of the first combination circuit.

6. The filter circuit as claimed in claim 5, wherein:

said second plurality of adjustable coefficient sections comprise fourth and fifth adjustable coefficient sections each having a coefficient factor C, said input means of the second combination circuit comprises first, second and third respective inputs, and said second coupling means couples the fourth adjustable coefficient section between the output of the first combination circuit and the first input of the second combination circuit, the third filter between the output of the first combination circuit and the second input of the second combination circuit, and the third filter and the fifth adjustable coefficient section in series between the output of the first combination circuit and the third input of the second combination circuit.

7. The filter circuit as claimed in claim 6 wherein the first and second combination circuits comprise first and second summing circuits, respectively, said first and second inputs of the first summing circuit each comprise an add input and said third and fourth inputs thereof each comprise a subtract input, and said first and second inputs of the second summing circuit each comprise an add input and said third input thereof comprises a subtract input.

* * * * *